(12) United States Patent
Tsunekazu et al.

(10) Patent No.: US 7,701,224 B2
(45) Date of Patent: Apr. 20, 2010

(54) WIRE ABNORMALITY DETECTING DEVICE

(75) Inventors: Shoso Tsunekazu, Chiyoda-ku (JP); Koji Hashimoto, Tokyo (JP); Daisuke Eguchi, Tokyo (JP)

(73) Assignee: Mitsubishi Electric Corp., Chiyoda-ku, Tokyo (JP)

( * ) Notice: Subject to any disclaimer, the term of this patent is extended or adjusted under 35 U.S.C. 154(b) by 218 days.

(21) Appl. No.: 11/964,234

(22) Filed: Dec. 26, 2007

(65) Prior Publication Data
US 2008/0231286 A1 Sep. 25, 2008

(30) Foreign Application Priority Data
Mar. 23, 2007 (JP) ............................. 2007-076146

(51) Int. Cl.
*G01R 31/02* (2006.01)
(52) U.S. Cl. ...................................... 324/543
(58) Field of Classification Search ................. 324/543
See application file for complete search history.

(56) References Cited

U.S. PATENT DOCUMENTS 4,757,313 A * 7/1988 Matsubara et al. .......... 340/3.43
4,977,359 A * 12/1990 Sawai et al. ................. 318/561

FOREIGN PATENT DOCUMENTS

| JP | 11-64040 A | 3/1999 |
| JP | 11-283456 A | 10/1999 |
| JP | 2000-205893 A | 7/2000 |

\* cited by examiner

*Primary Examiner*—Timothy J Dole
(74) *Attorney, Agent, or Firm*—Sughrue Mion, PLLC

(57) ABSTRACT

A sensor switch 111a connected to a constant voltage Vc via a breeder resistor 114a and dropper diodes 112a and 113a is connected to a microprocessor 120 that configures a wire abnormality detecting device 100, and the electric potential of the connection point between the dropper diodes 112a and 113a is inputted to the microprocessor 120 as a switch logic signal D1 via a signal wire 105 and a series resistor 131a. The signal voltage level of the switch logic signal D1 is inputted to the microprocessor 120 via an AD converter 123, and the microprocessor 120 cooperates with a program memory 121 to perform a determination of whether or not the signal voltage is in an abnormal intermediate voltage state. However, during a transitional period when the switch logic signal is changing between high and low, mistaken determination is prevented by avoiding abnormality determination.

9 Claims, 9 Drawing Sheets

WIRE ABNORMALITY DETECTING DEVICE

BACKGROUND OF THE INVENTION

1. Field of the Invention

The present invention relates to the improvement of a wire abnormality detecting device that is installed as a partial function in an in-vehicle electronic control device such as an engine control device or a transmission control device, for example, and in particular to a wire abnormality detecting device that detects an abnormality in a signal wire of a sensor switch that is inputted as a switch logic signal with respect to a microprocessor.

2. Description of the Related Art

Sensor switches serving as various switch logic signals are connected to an in-vehicle electronic control device and, from the standpoint of safety control of the vehicle, detecting an abnormality such as a wire breakage abnormality of a signal wire, a ground fault abnormality that is a short circuit abnormality with a negative power source wire, and a short-to-supply fault abnormality that is a short circuit abnormality with a positive power source wire is performed.

It will be noted that wire abnormalities such as a wire breakage abnormality, a ground fault abnormality and a short-to-supply fault abnormality mentioned here are a concept that includes a short circuit abnormality between printed patterns resulting from conductive foreign matter or a soldering defect in an in-vehicle electronic control device or inside a jointly used sensor, or an abnormality resulting from a connection defect in a connecting connector, and abnormality detection including an abnormal state where these internal abnormalities cause an apparent wire abnormality is performed.

When the connected sensor switch is a 2 phase type encoder for detecting the rotation angle of a motor driven by a motor control device including a wire abnormality detecting function, for example, detection of an input wire abnormality can be performed by monitoring the corresponding relationship between the content of the drive command and the operating state of the encoder.

For example, the "encoder abnormality detecting device" of JP-A-11-64040 performs abnormality determination by whether or not the counting direction of an up/down counter with respect to 2 phase signals that an encoder generates matches a rotational direction that has been commanded.

Further, according to the "pulse encoder connection defect detecting circuit" of JP-A-2000-205893, technology is disclosed which compares and determines, by an encoder, an actual output voltage with a voltage level that is to be outputted by the encoder and transmits the abnormality determination result to an electronic control device.

As prior art when the connected sensor switch is a common contact or noncontact switch signal that detects the operation limit position of an actuator or the operating state of an operation switch, for example, there is the "switch, information detecting device having the same, and connection state detecting device for connector" of JP-A-11-283456.

According to JP-A-11-283456, a series resistor and a parallel capacitor are disposed with respect to a switch element, a pulse signal is supplied with respect to the switch element, and the voltage thereof is monitored by an AD converter to determine whether or not there is a wire abnormality.

Whereas the abnormality detecting device according to JP-A-11-64040 has the problem that abnormality determination cannot be performed in a state where the encoder is stopped, the connection defect detecting circuit according to JP-A-2000-205893 has the drawback that, although abnormality determination can be performed even in a state where the encoder is stopped, an abnormality determining circuit is disposed in the encoder and a signal wire for transmitting the determination result to the control device becomes additionally necessary.

Further, the detecting device according to JP-A-11-283456 has the problem that accurate abnormality determination cannot be performed because the output voltage of the AD converter changes due to the affects of a noise filter disposed in an input circuit of the sensor switch or the output voltage of the AD converter changes due to variations in the opening/closing timing of the sensor switch and the application timing of the pulse signal for measurement.

SUMMARY OF THE INVENTION

It is a first object of this invention to provide a wire abnormality detecting device that can avoid mistaken determination in the logic change timing of a switch logic signal inputted to a microprocessor and perform accurate abnormality determination.

It is a second object of this invention to provide a wire abnormality detecting device that can jointly use simple determining means and detailed determining means to perform efficient abnormality determination.

A wire abnormality detecting device according to this invention is a wire abnormality detecting device that detects an abnormality in a signal wire of a sensor switch that is inputted as a switch logic signal with respect to a microprocessor, wherein the microprocessor is disposed with at least a program memory including a program that serves as intermediate voltage state detecting means, transitional period determining means that configures detailed determining means, and intermediate voltage abnormality determining means and an AD converter that measures the signal voltage level relating to the switch logic signal.

The intermediate voltage state detecting means is means that determines, by monitoring the digital output of the AD converter, when the logic of the switch logic signal exceeds a first threshold corresponding to a first signal voltage when the logic of the switch logic signal is low and when the logic of the switch logic signal is less than a second threshold corresponding to a second signal voltage when the logic of the switch logic signal is high.

The transitional period determining means is means that detects a transitional period when the logic level of the switch logic signal changes from a low to a high or from a high to a low level.

The intermediate voltage abnormality determining means is means that acts when the intermediate voltage state detecting means has detected an intermediate voltage state, excluding a period when the transitional period determining means is detecting a transitional period, and determines that an intermediate voltage abnormality has occurred.

The wire abnormality detecting device detects, by the intermediate voltage abnormality determining means, an abnormality resulting from incomplete contact between the signal wire and a positive power source wire or a negative power source wire or from contact or the like between the signal wire and another analog signal wire.

According to the wire abnormality detecting device according to this invention, there is the effect that the wire abnormality detecting device can capture the signal voltage level of a switch logic signal using an AD converter and detect an intermediate voltage state, and can avoid abnormality determination during a process where the logic signal voltage smoothly changes because of the affects of a noise filter or the like disposed in an input signal circuit to ensure that the wire abnormality detecting device does not perform mistaken determination.

The foregoing and other objects, features, aspects, and advantages of the present invention will become more apparent from the following detailed description of the present invention when taken in conjunction with the accompanying drawings.

BRIEF DESCRIPTION OF THE DRAWINGS

Embodiments of the present invention will be described in detail below with reference to the accompanying drawings, wherein.

DETAILED DESCRIPTION OF THE INVENTION

Embodiment 1

Figure 1:
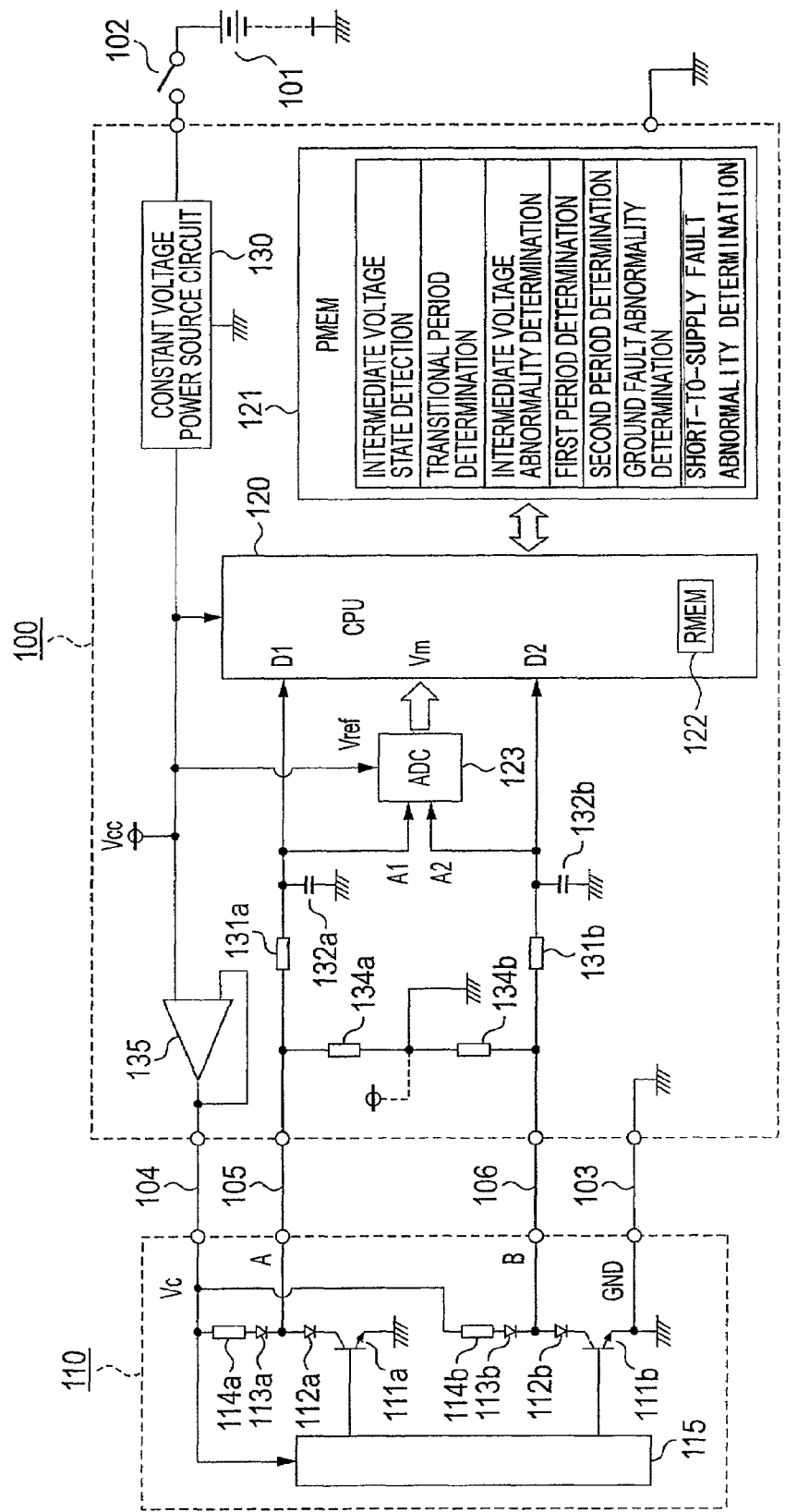
FIG. 1 is a block circuit diagram showing embodiment 1 of this invention.

FIG. 1, which is a block circuit diagram of embodiment 1 of this invention, will be described below.

Turning now to FIG. 1, a wire abnormality detecting device 100 in actuality configures a control device of an in-vehicle engine, for example, and electricity is supplied thereto via a power source switch 102 resulting from a key switch or the like from a variable power source 101 that is an in-vehicle battery, for example, whose power source voltage varies.

Numerous input/output signals are connected to the in-vehicle engine control device, and some of those input signals become targets of wire abnormality detection; for example, a rotary encoder 110 is connected to the wire abnormality detecting device 100 that is an in-vehicle engine control device disposed with a wire abnormality detecting function.

The rotary encoder 110 receives the supply of a constant drive voltage Vc of DC 5 V, for example, via a negative power source line 103 and a positive power source line 104 from the wire abnormality detecting device 100, and inputs an A-phase signal and a B-phase signal having a phase difference of 90 degrees to the wire abnormality detecting device 100 via signal wires 105 and 106.

The drive voltage Vc is applied via dropper diodes 112a and 113a and a breeder resistor 114a to a sensor switch 111a that is a transistor for outputting the A-phase signal, and a connection point between the dropper diodes 112a and 113a is connected to an A-phase signal output terminal.

Similarly, the drive voltage Vc is applied via dropper diodes 112b and 113b and a breeder resistor 114b to a sensor switch 111b that is a transistor for outputting the B-phase signal, and a connection point between the dropper diodes 112b and 113b is connected to a B-phase signal output terminal.

The sensor switches 111a and 111b that are transistors for outputting the A-phase and B-phase signals open and close in response to the rotation angle position of an unillustrated rotor by a rotation angle detecting circuit 115.

The wire abnormality detecting device 100 is configured with a microprocessor 120 as its main component, and connected via a bus to the microprocessor 120 are a nonvolatile program memory 121 that is a Flash Memory, for example, a RAM memory 122 for arithmetic processing, and a multi-channel sequential conversion type AD converter 123.

It will be noted that a program for wire abnormality detection shown in FIG. 3 to FIG. 6 is stored in the program memory 121 in addition to a control program serving as an engine control device.

A constant voltage power source circuit 130 is supplied with electricity via the power source switch 102 from the variable power source 101 that generates an output voltage of DC 8 V to 16 V, for example, and the constant voltage power source circuit 130 generates a stabilizing constant voltage output Vcc of DC 5 V, for example, supplies electricity to the microprocessor 120, the program memory 121, the RAM memory 122 and the AD converter 123, and supplies the drive voltage Vc with respect to the rotary encoder 110 via a buffer amp 135.

One end of a series resistor 131a is connected to the A-phase output terminal of the rotary encoder 110 and is also connected to a ground circuit via a pull-down resistor 134a, the other end is connected to a filter capacitor 132a, and the double ended voltage of the filter capacitor 132a is inputted to a digital input port of the microprocessor 120 as a switch logic signal D1.

Similarly, one end of a series resistor 131b is connected to the B-phase output terminal of the rotary encoder 110 via signal wire 106 and is also connected to the ground circuit via a pull-down resistor 134b, the other end is connected to a filter capacitor 132b, and the double ended voltage of the filter capacitor 132b is inputted to a digital input port of the microprocessor 120 as a switch logic signal D2.

Further, the double ended voltages of the filter capacitors 132a and 132b are connected to analog input terminals of the AD converter 123 as analog signal inputs A1 and A2, and the digitally converted values thereof are inputted to the microprocessor 120 as a monitored voltage Vm.

Consequently, the voltage levels of the switch logic signals D1 and D2 are inputted to the AD converter 123 as they are as the analog signal inputs A1 and A2.

It will be noted that, as described later, it is also possible to connect the one ends of the pull-down resistors 134a and 134b to the constant voltage output Vcc to create pull-up resistors rather than connect them to the ground circuit.

Next, FIG. 2, which shows a characteristic line diagram of an input signal in the block circuit of FIG. 1, will be described.

Figure 2:
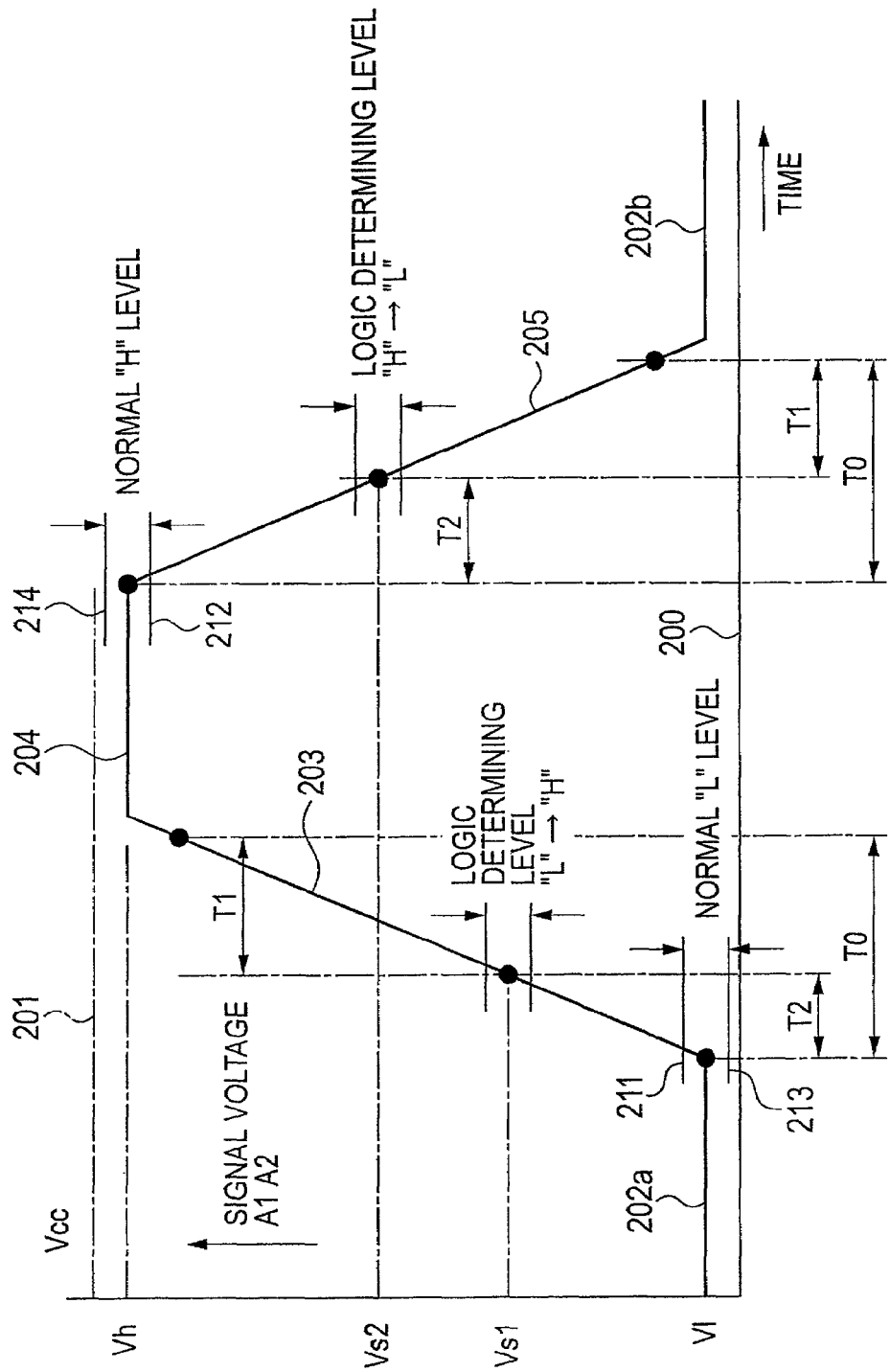
FIG. 2 is a characteristic line diagram of an input signal in embodiment 1.

Turning now to FIG. 2, the horizontal axis is a time axis, and the vertical axis represents the signal voltage level of the analog signal input A1 or A2.

The signal voltage level is between a minimum input voltage level 200 that is a ground level and a maximum input voltage level 201 that corresponds to the constant voltage output Vcc, and raised low level voltages 202a and 202b correspond to a first residual voltage generated by the dropper diodes 112a and 112b when the sensor switches 111a and 111b are closed.

A rising transitional period voltage 203 and a falling transitional period voltage 205 are expressed by slanted signals where smooth signal voltage changes resulting from filter characteristics determined by the product of the resistance values of the series resistors 131a and 131b and the capacitances of the filter capacitors 132a and 132b are simplified.

A checked high level voltage 204 is a voltage obtained by subtracting, when ΔV represents a second residual voltage generated by the dropper diodes 113a and 113b when the sensor switches 111a and 111b are open, the second residual voltage ΔV from the maximum input voltage level 201.

Consequently, the signal voltage level in an ordinary state is between the raised low level voltages 202a and 202b and the checked high level voltage 204, and the switch logic signals D1 and D2 are recognized as logic "H" (high) when the signal voltage level rises above a first logic determining voltage Vs1 and are recognized as logic "L" (low) when the signal voltage level falls to equal or less than a second logic determining voltage Vs2.

It will be noted that these logic determining levels are characteristics that are determined as input determining specifications of the microprocessor 120.

A first period T1 is a period from when the switch logic signals D1 and D2 change from "L" to "H" to until the signal voltage level rises to 90% or higher, for example, of the variation width (checked high level voltage 204—raised low level voltage 202a) or is a period from when the switch logic signals D1 and D2 change from "H" to "L" to until the signal voltage level falls to 10% or lower, for example, of the variation width (checked high level voltage 204—raised low level voltage 202b).

A second period T2 is a period from when the switch logic signals D1 and D2 begin rising to until they change from "L" to "H" or is a period from when the switch logic signals D1 and D2 start falling to until they change from "H" to "L".

It will be noted that because there are characteristic variations as parts, a voltage drop resulting from the dropper diodes 112a and 112b is determined to be a normal state when the upper limit of the raised low level voltages 202a and 202b is represented by a first threshold 211, the lower limit is represented by a third threshold 213, and a low level signal voltage is between the third threshold 213 and the first threshold 211.

Similarly, because there are characteristic variations as parts, a voltage drop resulting from the dropper diodes 113a and 113b is determined to be a normal state when the upper limit of the checked high level voltage 204 is represented by a fourth threshold 214, the lower limit is represented by a second threshold 212, and a high level signal voltage is between the second threshold 212 and the fourth threshold 214.

Here, assuming various wire abnormalities, first, when a ground fault accident occurs where the signal wires 105 and 106 short-circuit contact the negative power source wire 103, this is detected as a result of the signal voltage level becoming equal to or lower than the third threshold 213 because the voltage drop resulting from the dropper diodes 112a and 112b disappears.

Next, when a short-to-supply fault accident occurs where the signal wires 105 and 106 short-circuit contact the positive power source wire 104, this is detected as a result of the signal voltage level becoming equal to or higher than the fourth threshold 214 because the voltage drop resulting from the dropper diodes 113a and 113b disappears.

In the case of a wire breakage accident of the signal wires 105 and 106, this is detected as a result of the signal voltage level becoming equal to or lower than the third threshold 213 because of the pull-down resistors 134a and 134b, and is handled as an accident that is apparently the same as a ground fault accident.

However, when the connection positions of the pull-down resistors 134a and 134b are changed to the illustrated dotted line position to create pull-up resistors, then the signal voltage level exceeds the fourth threshold 214 when a wire breakage accident of the signal wires 105 and 106 occurs, so this is handled as an apparent short circuit accident.

When the signal wires 105 and 106 incompletely contact the positive power source wire 104 or the negative power source wire 103 or touch another analog signal wire, then an intermediate voltage state occurs where the signal voltage level exceeds the first threshold 211 and is less than the second threshold 212.

However, at a transitional period T0 immediately after the sensor switches 111a and 111b open and close, an intermediate voltage state occurs also because of the affects of the filter capacitors 132a and 132b, so it is necessary to perform detailed determination so as to not mistakenly recognize this as a wire abnormality.

Next, the action and operation of embodiment 1 of this invention configured as shown in FIG. 1 will be described on the basis of a flowchart of abnormality determination operation shown in FIG. 3.

Figure 3:
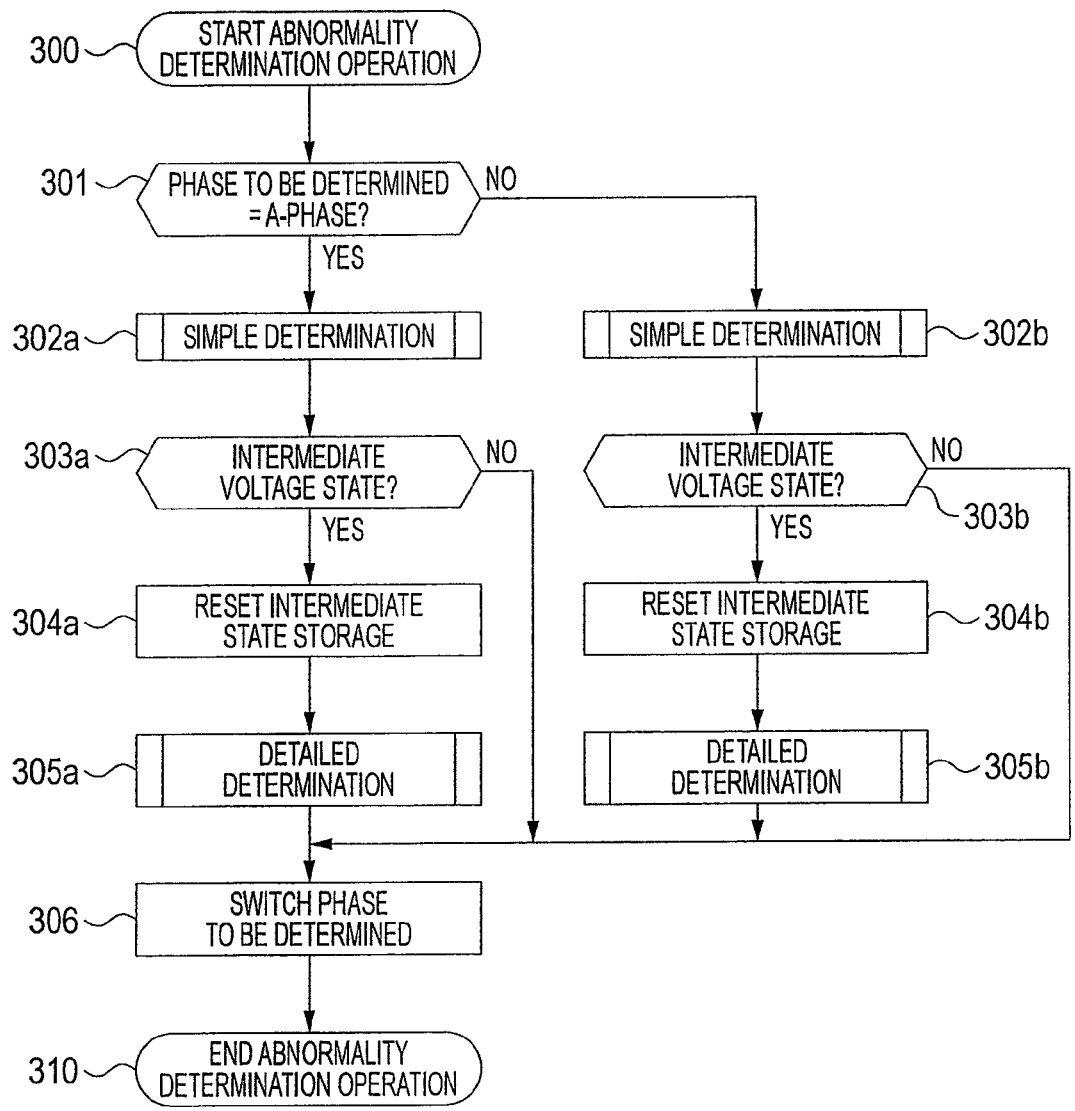
FIG. 3 is a flowchart of abnormality determination operation in embodiment 1.

Turning now to FIG. 3, step 300 is a step where the microprocessor 120 starts wire abnormality detection operation, the next step 301 is a step of determining whether or not the phase for which wire abnormality detection is to be performed is the A-phase or the B-phase, and in initial operation the phase is the A-phase and thereafter the phase to be determined is alternately switched by a later-described step 306.

Step block 302a is a step block that is executed when the determination of step 301 is YES and the phase to be determined is the A-phase, and the details of this step block 302a will be described later by FIG. 4.

Figure 4:
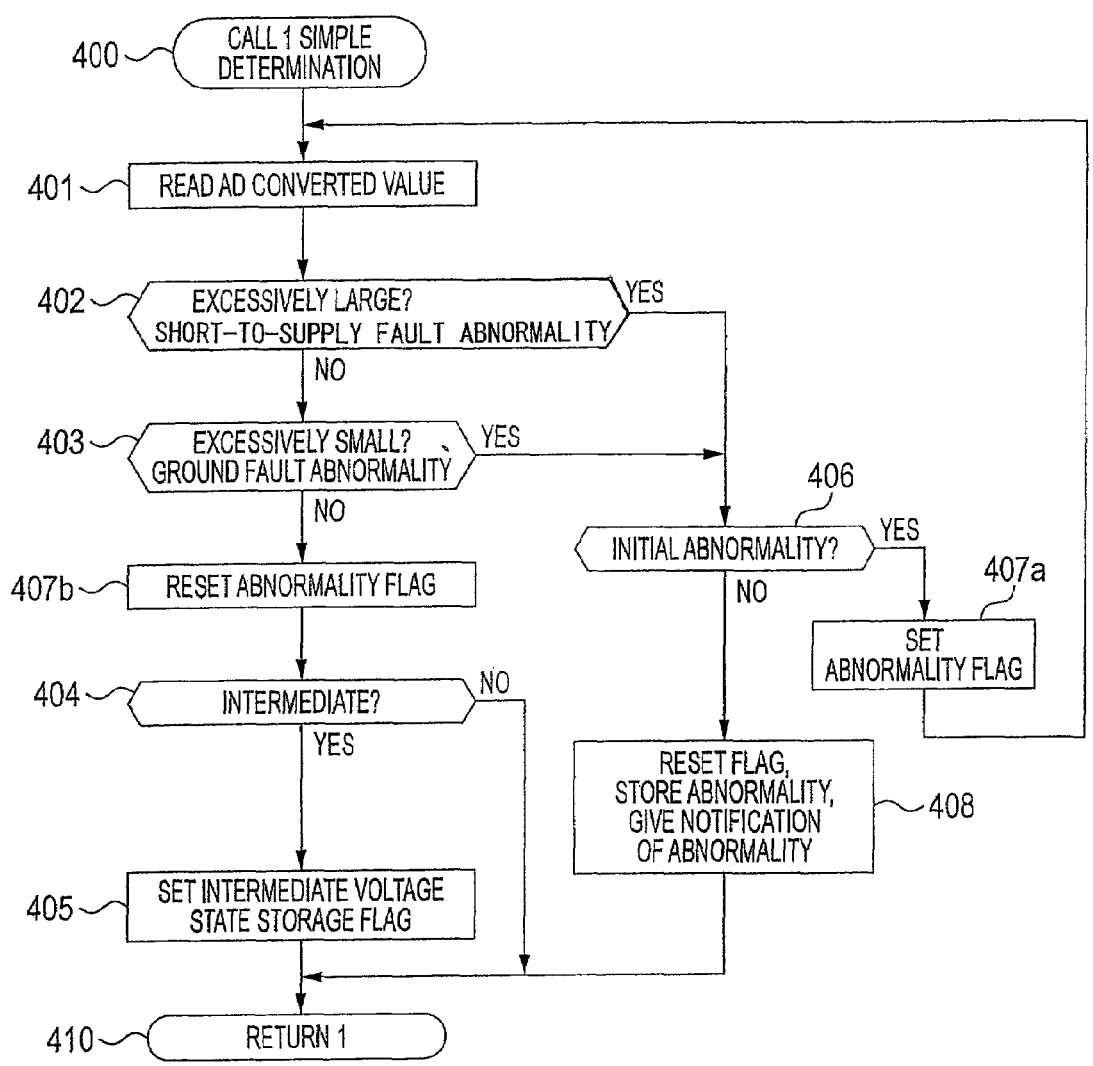
FIG. 4 is a flowchart of simple determination operation in embodiments 1 and 2.

The next step 303a is a step of determining whether or not an intermediate voltage state storage flag is operating by step 405 of FIG. 4 as the execution result of step block 302a, and when the determination result by this step 303a is an intermediate voltage state, then the flow moves to step 304a, and when the determination is not an intermediate voltage state, then the flow moves to step 306.

In step 304a, the intermediate voltage state storage flag that was set in step 405 of FIG. 4 is reset and the flow moves to step block 305a, but the operation of step block 305a will be described later by FIG. 5.

Step block 302b is a step block that is executed when the determination of step 301 is NO and the phase to be determined is the B-phase, and the details of this step block 302b will be described later by FIG. 4.

The next step 303b is a step of determining whether or not an intermediate voltage state storage flag is operating by step 405 of FIG. 4 as the execution result of step block 302b, and when the determination result by this step 303b is an intermediate voltage state, then the flow moves to step 304b, and when the determination result is not an intermediate voltage state, then the flow moves to step 306.

In step 304b, the intermediate voltage state storage flag that was set in step 405 of FIG. 4 is reset and the flow moves to step block 305b, but the operation of step block 305b will be described later by FIG. 5.

Step 306, which is executed when the determination of steps 303a and 303b is NO or after step blocks 305a and 305b, is a step of switching the phase to be determined, and in the next operation end step 310, the microprocessor 120 executes another control operation, operation start step 300 is again activated after a predetermined amount of time, and the microprocessor 120 repeatedly executes the flow thereafter.

It will be noted that step blocks 302a and 302b are simple determining means, step blocks 305a and 305b are detailed determining means, and the simple determining means performs the determination of whether or not the signal voltage level is an intermediate voltage state and the determination of whether the signal voltage level is a normal state, a ground fault abnormality state or a short circuit abnormality state when the signal voltage level is not an intermediate voltage state.

The detailed determining means is executed only when an intermediate voltage state has been detected by the simple determining means so that it can perform all determinations of whether there was merely a period when the signal voltage changed or an intermediate voltage abnormality state, or whether the signal voltage level is a normal state, a ground fault abnormality state, or a short circuit abnormality state.

FIG. 4 shows a flowchart of the simple determination operation shown as step blocks 302a and 302b in FIG. 3.

Turning now to FIG. 4, step 400 is an operation start step of a sub-routine program to which the flow moves when steps blocks 302a and 302b of FIG. 3 have been activated, and the next step 401 is a step of reading the monitored voltage Vm that is a value where the analog signal voltage A1 or A2 has been digitally converted by the AD converter 123.

In the next step 402, it is determined whether or not the AD converted value that was read in step 401 is an excessively large state equal to or higher than the fourth threshold 214 in FIG. 2, and when the AD converted value is excessively large, then the flow moves to step 406, and when the AD converted value is not excessively large, then the flow moves to step 403.

In step 403, it is determined whether or not the AD converted value that was read in step 401 is an excessively small state equal to or lower than the third threshold 213 in FIG. 2, and when the AD converted value is excessively small, then the flow moves to step 406, and when the AD converted value is not excessively small, then the flow moves to step 404.

In step 407b, an abnormality flag that was set in a later-described step 407a is reset, and the flow moves to step 404, and in step 404, it is determined whether or not the AD converted value that was read in step 401 is an intermediate voltage state where it exceeds the first threshold 211 in FIG. 2 and is less than the second threshold 212, and when the AD converted value is the intermediate voltage state, then the flow moves to step 405, an intermediate voltage state storage flag is set, and the flow moves to return step 410, and when the determination result of step 404 is not an intermediate voltage state, then the flow moves to return step 410.

It will be noted that the state where the determination of step 404 is not the intermediate voltage state is a normal state where the signal voltage level of FIG. 2 is between the third threshold 213 and the first threshold 211 which is a normal low level or between the second threshold 212 and the fourth threshold 214 which is a normal high level.

In step 406, which is executed when the determination of step 402 or step 403 is YES, it is determined whether or not the abnormality is an initial abnormality before an abnormality flag is set by a later-described step 407a, and if the abnormality is an initial abnormality, then the flow moves to step 407a, an abnormality flag is set, and the flow returns again to step 401, and if the abnormality is not an initial abnormality and a previous abnormality has already been stored by step 407a, then the flow moves to step 408.

In step 408, the abnormality storage flag that was set in step 407a is reset, the abnormality occurrence is confirmed and stored, an abnormality notification command is generated, and the flow moves to return step 410.

It will be noted that the abnormality content that is confirmed and stored by step 408 is a short-to-supply fault abnormality when step 402 was an excessively large abnormality determination and a ground fault abnormality or a wire breakage abnormality when step 403 was an excessively small determination.

After the flow moves to step 410, the flow moves to step 303a or 303b of FIG. 3, and when an intermediate voltage state storage flag has been set in step 405, then it is reset by steps 304a and 304b of FIG. 3.

To generally describe the operation of the simple determining means shown in FIG. 4, step 402 is short-to-supply fault abnormality determining means, step 403 is ground fault abnormality determining means, step 404 is intermediate voltage state detecting means, and step 406 is reconfirming means with respect to a short-to-supply fault abnormality or a ground fault abnormality, and in this simple determining means, abnormality determination when the signal voltage level is an intermediate voltage state is excluded to execute normal determination, short-to-supply fault abnormality determination, and ground fault abnormality determination when the signal voltage level is outside the intermediate voltage state.

Figure 5:
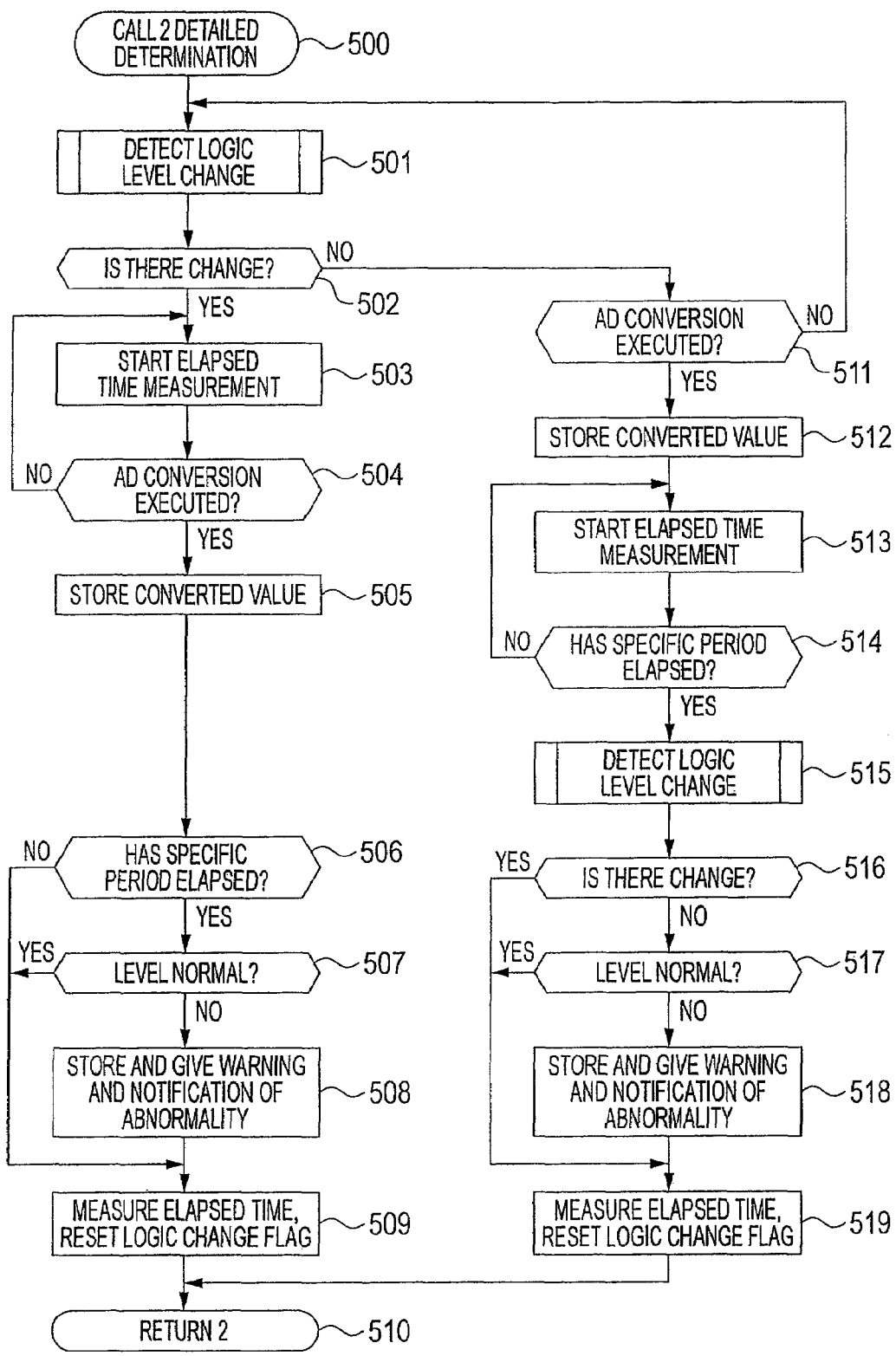
FIG. 5 is a flowchart of detailed determination operation in embodiments 1 and 2.

FIG. 5 shows a flowchart of the detailed determination operation shown as step blocks 305a and 305b in FIG. 3.

Turning now to FIG. 5, step 500 is an operation start step of a sub-routine program to which the flow moves when step blocks 305a and 305b of FIG. 3 have been activated, and the next step block 501 is a step block for logic level change detection that will be described in detail in FIG. 6.

Figure 6:
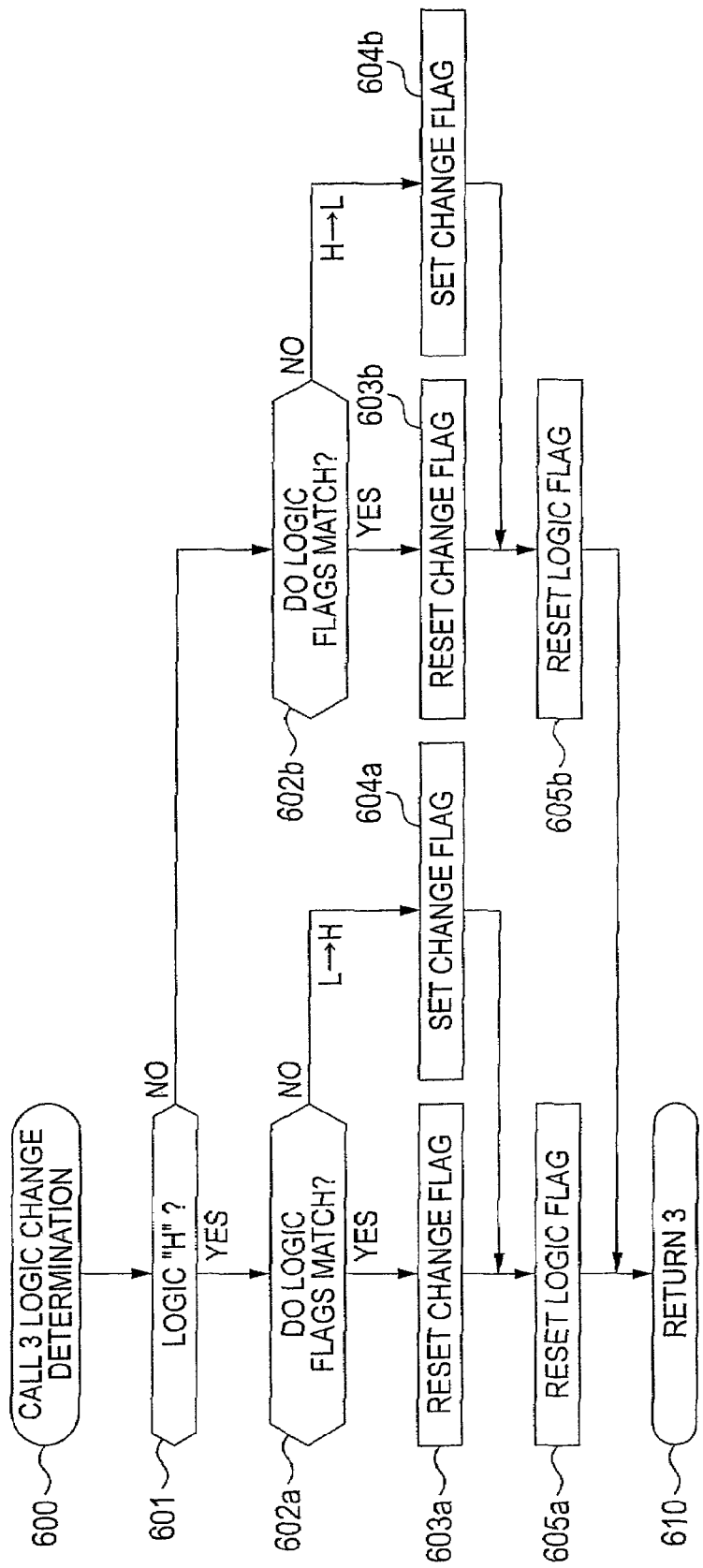
FIG. 6 is a flowchart of logic change determination operation in embodiments 1 and 2.

The next step 502 is a step of determining whether or not there is a logic change by whether or not a change flag has been set by steps 604a and 604b of FIG. 6, and when there is a logic change, then the flow moves to step 503, and when there is no logic change, then the flow moves to step 511.

In step 503, the elapsed time from when the determination of step 502 becomes YES begins to be measured by an unillustrated elapse timer, and in the next step 504, it is determined whether or not the AD converter 123 has executed AD conversion of the signal voltage of the phase to be determined, and when AD conversion has not been executed, then the flow returns to step 503 and counting by the elapse timer continues, and when the determination of step 504 is that AD conversion has been executed, then the flow moves to step 505 and the AD converted value of the signal voltage is read and temporarily stored.

In the next step 506, it is determined whether or not the elapsed time from when step 502 performs the determination that there is a logic change to until step 504 performs the determination of AD conversion execution is equal to or greater than a specific period corresponding to the transitional period T0 of FIG. 2, and when the elapsed time is equal to or greater than the transitional period T0, then a valid determination is performed, and when the elapsed time is less than the transitional period T0, then an invalid determination is performed.

It will be noted that when the determination of the execution timing of AD conversion by step 504 is immediately after the timing of the logic change by step 502, then this is included in the transitional period when the signal voltage changes, so in step 506 a determination of NO that is not a valid period of abnormality determination is performed and the flow moves to step 509, and when the elapsed time is sufficient, then the change transitional period has passed, so in step 506 a determination of YES that is a valid period of abnormality determination is performed and the flow moves to step 507.

In step 507, a determination of level normal YES is performed when the AD converted value that was temporarily stored in step 505 is between the third threshold 213 and the first threshold 211 of FIG. 2 or between the second threshold 212 and the fourth threshold 214 and the flow moves to step 509, and when the AD converted value is a signal level outside of that, then a determination of NO is performed and the flow moves to step 508.

In step 508, the abnormality state is stored as a ground fault abnormality when the signal voltage level is equal to or lower than the third threshold 213, as a short-to-supply fault abnormality when the signal voltage level is equal to or higher than the fourth threshold 214, or as an intermediate voltage abnormality when the signal voltage level exceeds the first threshold 211 and is lower than the second threshold 212, an abnormality notification command is generated, and the flow moves to step 509.

In step 509, the elapse timer that was started in step 503 is stopped, the present value is reset, the change flag that was set in steps 604a and 604b of FIG. 6 is reset, and the flow moves to return step 510.

In step 511, which is executed when the determination of step 502 was that there is no logic change, it is determined whether or not the AD converter 123 has executed AD conversion of the signal voltage of the phase to be determined, and when AD conversion has not been executed, then the flow returns to step block 501, and step block 501, step 502 and step 511 are cyclically executed, and when the determination of step 511 is finally that AD conversion has been executed, then the flow moves to step 512 and the AD converted value of the signal voltage is read and temporarily stored.

In step 513, the elapsed time from when the determination of step 511 becomes YES begins to be measured by the unillustrated elapse timer, and in the next step 514, it is determined whether or not the elapse timer that was started in step 513 has elapsed past a specific period corresponding to the transitional period T0, and when the specific period has not been passed, then the flow returns to step 513, counting by the elapse timer continues, the flow moves to step 515 when step 514 can perform the determination of the specific period elapse, and it is again determined whether or not there is a logic change.

In the next step 516, it is determined whether or not there is a logic change by whether or not the change flag has been set by steps 604a and 604b of FIG. 6, and when there is a logic change, then the flow moves to step 519, and when there is no logic change, then the flow moves to step 517.

It will be noted that when step 516 has detected that there is a logic change immediately after the specific period corresponding to the transitional period T0 has elapsed after step 511 detects the AD conversion execution timing, then there is the potential for the AD converted value that was stored by step 512 to become a value at the point in time when the signal voltage started changing, so this is regarded as outside the target of abnormality determination, and when step 516 has detected that there is no logic change immediately after the specific period corresponding to the transitional period T0 has elapsed after step 511 detects the AD conversion execution timing, then the AD converted value that was stored by step 512 is a value at a point in time when the signal voltage has not changed, so this is regarded as a target of abnormality determination and the flow moves to step 517.

In step 517, a determination of level normal YES is performed when the AD converted value that was temporarily stored in step 512 is between the third threshold 213 and the first threshold 211 of FIG. 2 or between the second threshold 212 and the fourth threshold 214 and the flow moves to step 519, and when the AD converted value is a signal level outside of that, then a determination of NO is performed and the flow moves to step 518.

In step 518, the abnormality state is stored as a ground fault abnormality when the signal voltage level is equal to or lower than the third threshold 213, as a short-to-supply fault abnormality when the signal voltage level is equal to or higher than the fourth threshold 214, and as an intermediate voltage abnormality when the signal voltage level exceeds the first threshold 211 and is less than the second threshold 212, an abnormality notification command is generated, and the flow moves to step 519.

In step 519, the elapse timer that was started in step 513 is stopped, the present value is reset, the change flag that was set in steps 604a and 604b of FIG. 6 is reset, and the flow moves to return step 510.

In return step 510, the flow next moves to step 306 of FIG. 3.

To generally describe the operation of the detailed determining means shown in FIG. 5, first period determining means shown in step 506 is means that determines, as a first transitional period, a specific period immediately after the determined logic of the switch logic signal has changed from a low to a high or from a high to a low level.

Further, second period determining means shown in step 514 is means that determines, as a second transitional period, when the determined logic of the switch logic signal has changed from a low to a high or from a high to a low level within a specific period after the AD converter has executed digital conversion of the switch logic signal voltage.

Moreover, steps 507 and 517 serve as intermediate voltage abnormality determining means, but in these steps, a ground fault abnormality state and a short-to-supply fault abnormality state can also be discriminated in addition to an intermediate voltage abnormality state.

FIG. 6 shows a flowchart of the logic change determination operation shown in step blocks 501 and 515 in FIG. 5.

Turning now to FIG. 6, step 600 is an operation start step of a sub-routine program to which the flow moves when step blocks 501 and 515 of FIG. 5 are activated, the next step 601 is a step of determining whether or not the switch logic signals D1 and D2 inputted to the microprocessor 120 are recognized as logic "H", and when the switch logic signals D1 and D2 are logic "H", then the flow moves to step 602a, and when the switch logic signals D1 and D2 are logic "L", then the flow moves to step 602b.

Step 602a determines whether or not a logic flag has been set by a later-described step 605a, and when a logic flag has been set and an "H" state has been stored, then a match determination is performed, the flow moves to step 603a, and the logic flag is reset by a later-described step 605b, and when an "L" state has been stored, then a no match determination is performed and the flow moves to step 604a.

In step 603a, a change flag that was set in step 604b is reset, and in step 604a, the change flag is set.

In step 605a, which is executed after step 603a or step 604a, the logic flag is set to "H" and the flow moves to return step 610.

Step 602b determines whether or not the logic flag has been reset by the later-described step 605b, and when the logic flag has been reset and an "L" state has been stored, then a match determination is performed and the flow moves to step 603b, and when the logic flag has been set by step 605a and an "H"

state has been stored, then a no match determination is performed and the flow moves to step 604b.

In step 603b, the change flag that was set in step 604a is reset, and in step 604b, the change flag is set.

In step 605b, which is executed after step 603b or step 604b, the logic flag is set to "L" and the flow moves to return step 610.

The step to which the flow moves after return step 610 is step 502 or step 516 of FIG. 5.

As is apparent from the above description, the wire abnormality detecting device 100 according to embodiment 1 of the present invention is a wire abnormality detecting device that detects an abnormality in the signal wires 105 and 106 of the sensor switches 111a and 111b that are inputted as the switch logic signals D1 and D2 with respect to the microprocessor 120, wherein the microprocessor 120 is disposed with at least the program memory 121 including a program that serves as the intermediate voltage state detecting means 404 and the detailed determining means 305a and 305b including the transitional period determining means 506 and 514 and the intermediate voltage abnormality determining means 507 and 517 and the AD converter 123 that measures the signal voltage level relating to the switch logic signals D1 and D2.

The intermediate voltage state detecting means 404 is means that determines, by monitoring the digital output of the AD converter 123, when the logic of the switch logic signals D1 and D2 exceeds the first threshold 211 corresponding to the first signal voltages 202a and 202b when the logic of the switch logic signals D1 and D2 is low and when the logic of the switch logic signals D1 and D2 is lower than the second threshold 212 corresponding to the second signal voltage 204 when the logic of the switch logic signals D1 and D2 is high.

The transitional period determining means 506 and 514 are means that detect a transitional period when the logic level of the switch logic signals D1 and D2 changes from a low to a high or from a high to a low level.

The intermediate voltage abnormality determining means 507 and 517 are means that act when the intermediate voltage state detecting means 404 has detected an intermediate voltage state, excluding a period when the transitional period determining means 506 and 514 are detecting a transitional period, and determine that an intermediate voltage abnormality has occurred.

It will be noted that the wire abnormality detecting device detects, by the intermediate voltage abnormality determining means 507 and 517, an abnormality resulting from incomplete contact between the signal wires 105 and 106 and the positive power source wire 104 or the negative power source wire 103 or from contact or the like between the signal wires 105 and 106 and another analog signal wire.

The transitional period determining means further include first and second period determining means 506 and 514.

The first period determining means 506 is means that determines, as a first transitional period, a specific period immediately after the determined logic of the switch logic signals D1 and D2 has changed from a low to a high or from a high to a low level.

The second period determining means 514 is means that determines, as a second transitional period, when the determined logic of the switch logic signals D1 and D2 has changed from a low to a high or from a high to a low level within a specific period after the AD converter 123 has executed digital conversion of the signal voltage relating to the switch logic signals D1 and D2.

The specific period corresponds to a transitional period T0 that is a maximum value of a time when the signal voltage level relating to the switch logic signals D1 and D2 moves from the first threshold 211 to the second threshold 212 or a time when the signal voltage level relating to the switch logic signals D1 and D2 moves from the second threshold 212 to the first threshold 211, and a value that has been digitally converted during the first transitional period or immediately before the second transitional period as the digitally converted value of the signal voltage relating to the switch logic signals by the AD converter 123 is excluded from the target of the intermediate voltage abnormality determination.

Consequently, the wire abnormality detecting device has the characteristic that it can accurately extract a transitional period when the signal voltage level relating to the switch logic signals is changing and avoid abnormality determination during that transitional period even with an asynchronous signal where there is no coordination between the timing of the logic change of the switch logic signals and the timing of the AD conversion of the AD converter.

The sensor switches 111a and 111b are disposed with a first dropper circuit and the program memory 121 further includes a program serving as the ground fault abnormality determining means 403.

The first dropper circuit is configured by a voltage drop circuit resulting from dropper diodes 112a and 112b that generate a first residual voltage as the raised low level voltages 202a and 202b when the sensor switches 111a and 111b are closed.

The ground fault abnormality determining means 403 is means that acts when the digitally converted value of the signal voltage relating to the switch logic signals by the AD converter 123 is equal to or lower than the third threshold 213 that is a value smaller than the first residual voltage, and determines that a ground fault abnormality that is short circuit contact between the signal wires 105 and 106 and the negative power source wire 103 or a wire breakage abnormality of the signal wires 105 and 106 has occurred.

Consequently, the wire abnormality detecting device has the characteristic that an abnormality such as a ground fault or wire breakage is also detected in addition to an abnormal state where the signal wires 105 and 106 are an intermediate voltage state, and it can accurately detect an abnormal state by the AD converter 123.

The sensor switches 111a and 111b are connected to the constant voltage power source circuit 130 via the breeder resistors 114a and 114b that configure a second dropper circuit and the program memory 121 further includes a program serving as the short-to-supply fault abnormality determining means 402.

The second dropper circuit is configured by a voltage checking circuit resulting from the dropper diodes 113a and 113b that are series-connected with respect to the breeder resistors 114a and 114b and is a circuit that obtains a checked high level voltage 204 that is lower, by an amount corresponding to a second residual voltage, than the constant voltage output Vcc of the constant voltage power source circuit as a high level signal voltage when the sensor switches 111a and 111b are closed.

The short-to-supply fault abnormality determining means 402 is means that acts when the digitally converted value of the signal voltage relating to the switch logic signals by the AD converter 123 is equal to or higher than the fourth threshold 214 that is a value larger than a value where the second residual voltage is subtracted from the constant voltage output Vcc, and determines that a short-to-supply fault abnormality that is short circuit contact between the signal wires 105 and 106 and the positive power source wire 104 has occurred.

Consequently, the wire abnormality detecting device has the characteristic that a short-to-supply fault abnormality is also detected in addition to an abnormal state where the signal wires are an intermediate voltage state, and it can accurately detect an abnormal state by the AD converter 123 even with a small voltage drop.

The program memory 121 further includes a program serving as the simple determining means 302a and 302b.

The simple determining means 302a and 302b are means that measure the signal voltage relating to the switch logic signals of the sensor switches 111a and 111b every substantially constant period and immediately determine that the measured signal voltage is not an intermediate voltage abnormal state when the measured signal voltage is equal to or lower than the first threshold 211 or equal to or higher than the second threshold 212, and the wire abnormality detecting device confirms and determines, by the detailed determining means 305 and 305b, whether or not the signal voltage relating to the switch logic signals that has been measured is an intermediate voltage abnormality state when the signal voltage relating to the switch logic signals that has been measured exceeds the first threshold 211 and is less than the second threshold 212.

Consequently, the wire abnormality detecting device has the characteristic that it can shorten the determination time by avoiding execution of the detailed determining means as long as an intermediate voltage abnormality has not occurred including an abnormality such as when the wire abnormality determination time period coincidentally matches a transitional period when the signal voltage relating to the switch logic signals changes.

The program memory 121 further includes a program serving as the reconfirming means 406.

The reconfirming means 406 is means that acts when the ground fault abnormality determining means 403 or the short-to-supply fault abnormality determining means 402 has detected an abnormality in the signal wires 105 and 105, again executes abnormality determination by the ground fault abnormality determining means 403 or the short-to-supply fault abnormality determining means 402, and decides the abnormality determination result at the stage where a wire abnormality was able to be reconfirmed.

Consequently, the wire abnormality detecting device has the characteristic that it can improve the reliability of the abnormality determining function without mistakenly confirming and storing an abnormality determination when noise is mixed in with the signal wires 105 and 106.

Embodiment 2

Figure 7:
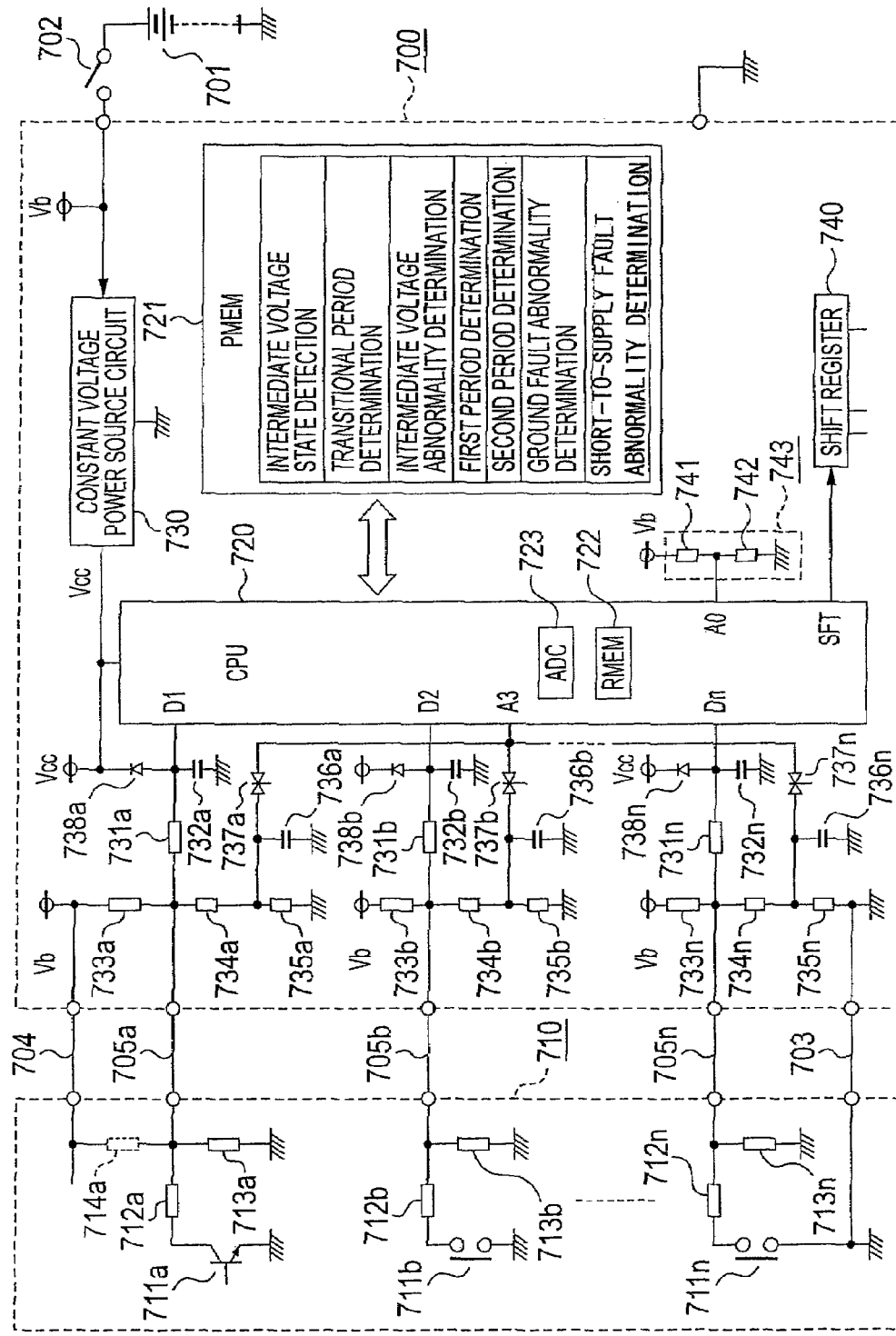
FIG. 7 is a block circuit diagram showing embodiment 2 of this invention.

FIG. 7, which shows a block circuit diagram of embodiment 2 of this invention, will be described below.

Turning now to FIG. 7, a wire abnormality detecting device 700 in actuality configures a control device of an in-vehicle engine, for example, and electricity is supplied thereto via a power source switch 702 resulting from a key switch or the like from a variable power source 701 that is an in-vehicle battery, for example, whose power source voltage varies.

Numerous input/output signals are connected to the in-vehicle engine control device, and some of those input signals become targets of wire abnormality detection; for example, a sensor switch group 710 is connected to the wire abnormality detecting device 700 that is an in-vehicle engine control device disposed with a wire abnormality detecting function.

The sensor switch group 710 receives the supply of a variable power source voltage Vb via a negative power source line 703 and a positive power source line 704 from the wire abnormality detecting device 700.

A sensor switch 711a that is a transistor is connected to a signal wire 705a via a series resistor 712a that is a voltage drop circuit, and a current dividing resistor 713a that is a voltage checking circuit is connected to a connection point between the series resistor 712a and the signal wire 705a.

Similarly, sensor switches 711b and 711n, which are connection point type sensors, are connected to signal wires 705b and 705n via series resistors 712b and 712n that are voltage drop circuits, and current dividing resistors 713b and 713n that are voltage checking circuits are connected to connection points between the series resistors 712b and 712n and the signal wires 705b and 705n.

It will be noted that it is also possible to connect a breeder resistor 714a as an alternative to a later-described breeder resistor 733a to the connection point between the series resistor 712a and the signal wire 705a, and the same is also true of the other sensor switches 711b and 711n.

Further, there are more numerous sensor switches of 711a and 711b to 711n than the three that are shown.

The wire abnormality detecting device 700 is configured with a microprocessor 720 as its main component, and connected via a bus to the microprocessor 720 are a nonvolatile program memory 721 that is a Flash Memory, for example, a RAM memory 722 for arithmetic processing, and a multi-channel sequential conversion type AD converter 723.

It will be noted that a program for wire abnormality detection shown in FIG. 4, FIG. 5, FIG. 6 and FIG. 9 is stored in the program memory 721 in addition to a control program serving as an engine control device.

A constant voltage power source circuit 730 is supplied with electricity via the power source switch 702 from the variable power source 701 that generates an output voltage of DC 8 V to 16 V, for example, and the constant voltage power source circuit 730 generates a stabilizing constant voltage output Vcc of DC 5 V, for example, supplies electricity to the microprocessor 720, the program memory 721, the RAM memory 722 and the AD converter 723, and supplies the variable power source voltage Vb to the sensor switch group 710 and unillustrated electrical load groups via the positive power source wire 704.

One end of a series resistor 731a is connected to the sensor switch 711a via the signal wire 705a and the series resistor 712a and is also connected to the variable power source voltage Vb via a breeder resistor 733a.

The other end of the series resistor 731a is connected to a filter capacitor 732a, and the double ended voltage of the filter capacitor 732a is inputted to a digital input port of the microprocessor 720 as a switch logic signal D1.

Voltage dividing resistors 734a and 735a are connected between a connection point between the breeder resistor 733a and the series resistor 731a and a ground circuit, and a filter capacitor 736a is connected in parallel to the voltage dividing resistor 735a of the negative side.

The same is also true of the sensor switches 711b and 711n: series resistors 731b and 731n, filter capacitors 732b and 732n, breeder resistors 733b and 733n, voltage dividing resistors 734b and 734n, voltage dividing resistors 735b and 735n, and filter capacitors 736b and 736n are connected.

The double ended voltages of the filter capacitors 736a, 736b and 736n are connected to an analog input port A3 of the microprocessor 720 via analog switches 737a, 737b and 737n that are selection switches.

Switch logic signal input terminals D1, D2 and Dn of the microprocessor 720 to which the filter capacitors 732a, 732b and 732n are connected are connected to output terminals of the constant voltage power source circuit 730 via voltage restricting diodes 738*a*, 738*b* and 738*n* to limit the upper limit of the switch logic signal voltage to substantially the constant voltage output Vcc or lower.

It will be noted that DC 5 V is obtained when the voltage of the variable power source 101 is a minimum value of about 8 V, and the voltages of the switch logic signals D1, D2 and Dn are for preventing the input voltage of the microprocessor 720 from becoming excessively large when the voltage of the variable power source 101 rises.

A shift register 740 that is used as a multiplexer is disposed with a shift command output that operates receiving a shift command signal SFT from the microprocessor 720 and cyclically sequentially alternately causes the analog switches 737*a*, 737*b* and 737*n* to be conductive.

It will be noted that the microprocessor 720 also generates a selection command output of plural bits to drive a decoder by this selection command output of plural bits and can also cyclically sequentially alternately cause the analog switches to be conductive by the output of the decoder.

Voltage dividing resistors 741 and 742 that configure a power source voltage measuring circuit 743 are series-connected to each other and connected to the variable power source voltage Vb, and a connection point between the voltage dividing resistors 741 and 742 is connected to an analog input port A0 of the microprocessor 720.

Next, FIG. 8, which is a characteristic line diagram of an input signal in the block circuit of FIG. 7, will be described.

Figure 8:
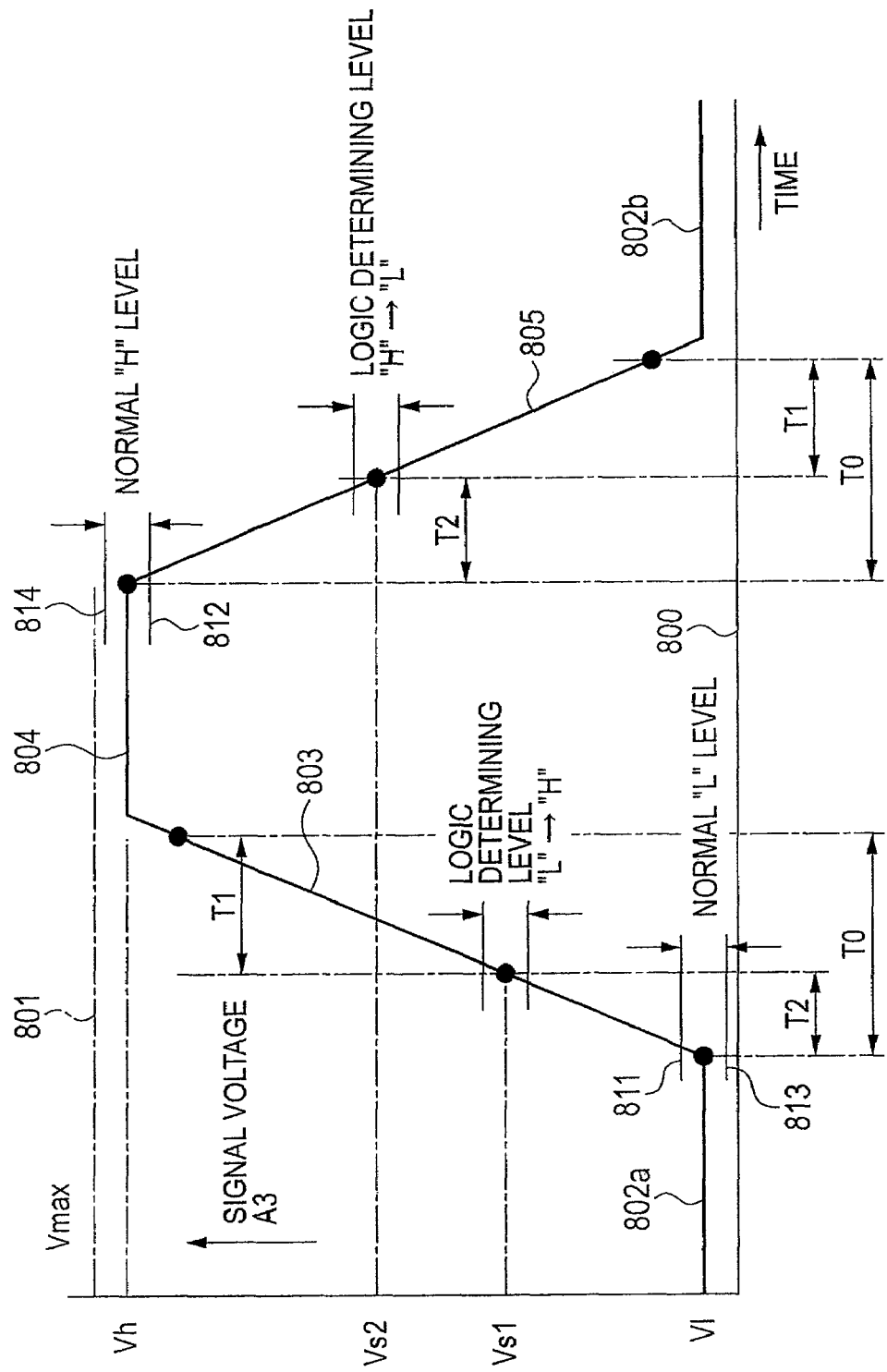
FIG. 8 is a characteristic line diagram of an input signal in embodiment 2.

Turning now to FIG. 8, the horizontal axis is a time axis, and the vertical axis represents the signal voltage level of the analog signal input A3.

It will be noted that when R712 represents the resistance value of the series resistors 712*a* and 712*b* to 712*n*, R713 represents the resistance value of the current dividing resistors 713*a* and 713*b* to 713*n*, R731 represents the resistance value of the series resistors 731*a* and 731*b* to 731*n*, R733 represents the resistance value of the breeder resistors 733*a* and 733*b* to 733*n*, R734 represents the resistance value of the voltage dividing resistors 734*a* and 734*b* to 734*n*, R735 represents the resistance value of the voltage dividing resistors 735*a* and 735*b* to 735*n*, and the resistance values are decided in the relationship of R712<<R733<<R713<<(R734+R735) <<R731, then an open circuit signal voltage Voff when the sensor switches 711*a* and 711*b* to 711*n* are open and a closed circuit signal voltage Von when the sensor switches 711*a* and 711*b* to 711*n* are closed are calculated by expressions (1) and (2).

$$Voff=[R713/(R733+R713)]\times[R735/(R734+R735)]\times Vb \quad (1)$$

$$Von=[R712/(R733+R712)]\times[R735/(R734+R735)]\times Vb \quad (2)$$

Further, when Vmax represents a hypothetical open circuit signal voltage when R733=0 in expression (1), the value of Vmax is calculated by expression (3).

$$Vmax=[R735/(R734+R735)]\times Vb=G\times Vb \quad (3)$$

Here, voltage division ratio G=R735/(R734+R735).

The signal voltage level of the analog signal input A3 is between a minimum input voltage level 800 that is a ground level and a maximum input voltage level 801 that corresponds to the hypothetical open circuit signal voltage Vmax resulting from expression (3), raised low level voltages 802*a* and 802*b* correspond to the closed circuit signal voltage Von that is a first residual voltage generated by the series resistor R712 when the sensor switches 711 and 711*b* to 711*n* are closed, and a checked high level voltage 804 corresponds to the open circuit signal voltage Voff calculated by expression (1).

In a rising transitional period voltage 803 and a falling transitional period voltage 805, assuming a capacitance C736 of the filter capacitors 736*a* and 736*b* to 736*n*, the signal voltage as the analog signal input A3 increases and decreases by an inclination angle determined by a time constant τ1=C736×(R734×R735)/(R734+R735).

Further, assuming that C732 represents the capacitance of the filter capacitors 732 and 732*b* to 732*n*, the increasing and decreasing time constant of the switch logic signals D1 and D2 to Dn becomes τ2=C732×R731, and the design value is τ1≈τ2.

Consequently, the signal voltage level in an ordinary state is between the raised low level voltages 802*a* and 802*b* and the checked high level voltage 804, and the switch logic signals D1 and D2 to Dn are recognized as logic "H" when the signal voltage level rises above a first logic determining voltage Vs1 and are recognized as logic "L" when the signal voltage level falls to equal to or lower than a second logic determining voltage Vs2.

However, these logic determining levels are values where the voltage division ratio G is multiplied by a characteristic value determined as an input determining specification of the microprocessor 720, and the analog signal input A3 is not the voltage of the switch logic signals D1 and D2 to Dn but a signal voltage relating to the switch logic signals D1 and D2 to Dn.

A first period T1 is a period from when the switch logic signals D1 and D2 to Dn change from "L" to "H" to until the signal voltage level rises to 90% or higher, for example, of the variation width (checked high level voltage-raised low level voltage) or is a period from when the switch logic signals D1 and D2 to Dn change from "H" to "L" to until the signal voltage level falls to 10% or lower, for example, of the variation width (checked high level voltage-raised low level voltage).

A second period T2 is a period from when the switch logic signals D1 and D2 to Dn begin rising to until they change from "L" to "H" or is a period from when the switch logic signals D1 and D2 to Dn start falling to until they change from "H" to "L".

A transitional period T0=T1+T2 is handled as a later-described specific period, but when the time constant τ2 of the switch logic signals is larger in comparison to the time constant τ1 of the analog input signal A3, the transitional period of the switch logic signals is handled as a specific period.

It will be noted that because there are characteristic variations as parts, a voltage drop resulting from the series resistor R712 is determined to be a normal state when the upper limit of the raised low level voltages 802*a* and 802*b* is represented by a first threshold 811, the lower limit is represented by a third threshold 813, and a low level signal voltage is between the third threshold 813 and the first threshold 811.

Similarly, because there are characteristic variations as parts, a voltage drop of the breeder resistor R733 resulting from the current dividing resistor R713 or the voltage dividing resistors R734 and R735 is determined to be a normal state when the upper limit of the checked high level voltage 804 is represented by a fourth threshold 814, the lower limit is represented by a second threshold 812, and a high level signal voltage is between the second threshold 812 and the fourth threshold 814.

Further, when the raised low level voltages 802*a* and 802*b* and the checked high level voltage 804 are obtained by the series resistor R712 and the current dividing resistor 713 without depending on dropper diodes such as shown in FIG. 1, then the values of the first threshold 811, the second threshold 812, the third threshold 813 and the fourth threshold 814 change in proportion to the variable power source voltage Vb, so when performing abnormality determination, it is necessary to measure the variable power source voltage Vb and compare and correct on the basis of the variable power source voltage Vb that has been measured.

Here, assuming various wire abnormalities, first, when a ground fault accident occurs where the signal wires 705a and 705b to 705n short-circuit contact the negative power source wire 703, this is detected as a result of the signal voltage level becoming equal to or lower than the third threshold 813 because the voltage drop resulting from the series resistor R712 disappears.

Next, when a short-to-supply fault accident occurs where the signal wires 705a and 705b to 705n short-circuit contact the positive power source wire 704, this is detected as a result of the signal voltage level becoming equal to or higher than the fourth threshold 814 because the voltage drop resulting from the breeder resistor R733 disappears.

In the case of a wire breakage accident of the signal wires 705a and 705b to 705n, this is detected as a result of the signal voltage level becoming equal to or lower than the fourth threshold 814 because the voltage drop of the breeder resistor R733 resulting from the current dividing resistor R713 disappears, and is handled as an accident that is apparently the same as a short-to-supply fault accident.

However, when the connection position of the breeder resistor R733 is changed and connected to the position of the breeder resistor 714a shown by the dotted line in FIG. 7, then the signal voltage level becomes equal to or lower than the third threshold 813 when a wire breakage accident of the signal wires 705a and 705b to 705n occurs, so this is detected as an apparent ground fault accident.

When the signal wires 705a and 705b to 705n incompletely contact the positive power source wire 704 or the negative power source wire 703 or touch another analog signal wire, then an intermediate voltage state occurs where the signal voltage level exceeds the first threshold 811 and is less than the second threshold 812.

However, at a transitional period T0 immediately after the sensor switches 711a and 711b to 711n open and close, an intermediate voltage state occurs also because of the affects of the filter capacitors 736a and 736b to 736n, so it is necessary to perform detailed determination so as to not mistakenly recognize this as a wire abnormality.

It will be noted that it is also possible to use dropper diodes such as shown in FIG. 1 instead of using the series resistor R712 and the current dividing resistor R713.

Conversely, it is also possible to use a series resistor and current dividing resistor like in FIG. 7 instead of dropper diodes in the block circuit of FIG. 1.

Next, the action and operation of embodiment 2 of this invention configured as shown in FIG. 7 will be described on the basis of a flowchart of abnormality determination operation shown in FIG. 9.

Figure 9:
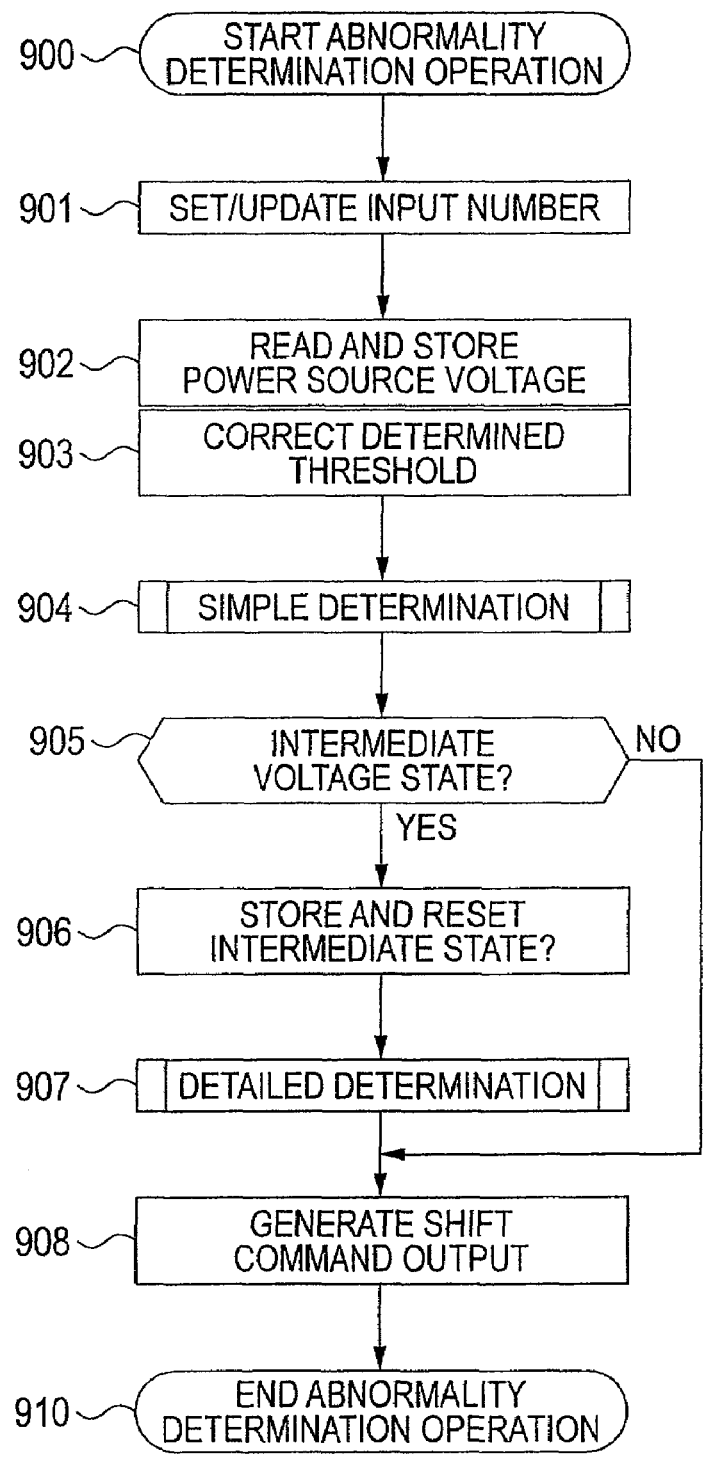
FIG. 9 is a flowchart of abnormality determination operation in embodiment 2.

Turning now to FIG. 9, step 900 is a step where the microprocessor 720 starts wire abnormality detection operation, the next step 901 is a step of setting and updating the input number for which wire abnormality detection is to be performed, and in initial operation the input is the first input and thereafter the input number sequentially increases by a later-described step 908, and after the final input number, it cyclically returns to the first input.

In step 902 that is executed next, the value of the variable power source voltage Vb that was inputted from the analog input port A0 of the microprocessor 720 and digitally converted by the AD converter 723 is read and stored, and the next step 903 is a step of correcting the first to fourth thresholds in response to the value of the variable power source voltage Vb that was read and stored in step 902.

Step block 904, which is executed next, serves as the simple determining means that was mentioned before in FIG. 4, and the simple determining means performs the determination of whether or not the signal voltage level is an intermediate voltage state and the determination of whether or not the signal voltage level is a normal state, a ground fault abnormality state or a short circuit abnormality state when the signal voltage level is not an intermediate voltage state.

The next step 905 is a step of determining whether or not an intermediate voltage state storage flag is operating by step 405 of FIG. 4 as the execution result of step block 904, and when the determination result by this step 905 is an intermediate voltage state, then the flow moves to step 906, and when the determination result is not an intermediate voltage state, then the flow moves to step 908.

In step 906, the intermediate voltage state storage flag that was set in step 405 of FIG. 4 is reset and the flow then moves to step block 907, and the operation of step block 907 serves as the detailed determining means that was mentioned before by FIG. 5.

It will be noted that the detailed determining means is executed only when an intermediate voltage state has been detected by the simple determining means so that it can perform all determinations of whether there was merely a period when the signal voltage changed or an intermediate voltage abnormality state, or whether the signal voltage level is a normal state, a ground fault abnormality state, or a short circuit abnormality state.

Step 908, which is executed when the determination of step 905 is NO or after step block 907, is a step of generating a shift pulse SFT with respect to the shift register 740 in order to switch the input number to be determined, and in the next operation end step 910, the microprocessor 720 executes another control operation, operation start step 900 is again activated after a predetermined amount of time, and the flow thereafter is repeatedly executed.

As is apparent from the above description, the wire abnormality detecting device 700 according to embodiment 2 of the present invention is a wire abnormality detecting device that detects an abnormality in the signal wires 705a and 705n to 705n of the sensor switches 711a and 711b to 711n that are inputted as the switch logic signals D1 and D2 to Dn with respect to the microprocessor 720, wherein the microprocessor 720 is disposed with at least the program memory 721 including a program that serves as the intermediate voltage state detecting means 404 and the detailed determining means 305a and 305b including the transitional period determining means 506 and 514 and the intermediate voltage abnormality determining means 507 and 517 and the AD converter that measures the signal voltage level relating to the switch logic signals D1 and D2 to Dn.

The intermediate voltage state detecting means 404 is means that determines, by monitoring the digital output of the AD converter 723, when the logic of the switch logic signals D1 and D2 to Dn exceeds the first threshold 811 corresponding to the first signal voltages 802a and 802b when the logic of the switch logic signals D1 and D2 to Dn is low and when the logic of the switch logic signals D1 and D2 to Dn is lower than the second threshold 812 corresponding to the second signal voltage 804 when the logic of the switch logic signals D1 and D2 to Dn is high.

The transitional period determining means 506 and 514 are means that detect a transitional period when the logic level of the switch logic signals D1 and D2 to Dn changes from a low to a high or from a high to a low level.

The intermediate voltage abnormality determining means 507 and 517 are means that act when the intermediate voltage state detecting means 404 has detected an intermediate voltage state, excluding a period when the transitional period determining means 506 and 514 are detecting a transitional period, and determine that an intermediate voltage abnormality has occurred.

It will be noted that the wire abnormality detecting device detects, by the intermediate voltage abnormality determining means 507 and 517, an abnormality resulting from incomplete contact between the signal wires 705a and 705b to 705n and the positive power source wire 704 or the negative power source wire 703 or from contact or the like between the signal wires 705a and 705b to 705n and another analog signal wire.

The transitional period determining means further include first and second period determining means 506 and 514.

The first period determining means 506 is means that determines, as a first transitional period, a specific period immediately after the determined logic of the switch logic signals D1 and D2 to Dn has changed from a low to a high or from a high to a low level.

The second period determining means 514 is means that determines, as a second transitional period, when the determined logic of the switch logic signals D1 and D2 to Dn has changed from a low to a high or from a high to a low level within a specific period after the AD converter 723 has executed digital conversion of the signal voltage relating to the switch logic signals D1 and D2 to Dn.

It will be noted that the specific period corresponds to a transitional period T0 that is a maximum value of a time when the signal voltage level relating to the switch logic signals D1 and D2 to Dn moves from the first threshold 811 to the second threshold 812 or a time when the signal voltage level relating to the switch logic signals D1 and D2 to Dn moves from the second threshold 812 to the first threshold 811, and a value that has been digitally converted during the first transitional period or immediately before the second transitional period as the digitally converted value of the signal voltage relating to the switch logic signals D1 and D2 to Dn by the AD converter 723 is excluded from the target of the intermediate voltage abnormality determination.

Consequently, the wire abnormality detecting device has the characteristic that it can accurately extract a transitional period when the signal voltage level relating to the switch logic signals is changing and avoid abnormality determination during that transitional period even with an asynchronous signal where there is no coordination between the timing of the logic change of the switch logic signals D1 and D2 to Dn and the timing of the AD conversion of the AD converter 723.

The sensor switches 711a and 711b to 711n are connected to a variable power source circuit via the breeder resistors 733a and 733b to 733n that configures a second dropper circuit, the power source voltage Vb of the variable power source circuit is digitally changed via the AD converter 723 from the power source voltage circuit 743 and inputted to the microprocessor 720, and the program memory 721 further includes a program serving as the short-to-supply fault abnormality determining means 402.

The second dropper circuit is configured by a voltage checking circuit resulting from the current dividing resistors 713a and 713b to 713n that are series-connected with respect to the breeder resistors 733a and 733b to 733n and connected in parallel to the sensor switches 711a and 711b to 711n and is a circuit that obtains the checked high level voltage 804 that is lower, by an amount corresponding to a second residual voltage, than the power source voltage Vb of the variable power source circuit as a high level signal voltage when the sensor switches 711a and 711b to 711n are opened.

The short-to-supply fault abnormality determining means 402 is means that acts when the digitally converted value of the signal voltage relating to the switch logic signals D1 and D2 to Dn by the AD converter 723 is equal to or higher than a fourth threshold that is a value larger than a value where the second residual voltage is subtracted from the power source voltage Vb, and determines that a short-to-supply fault abnormality that is short circuit contact between the signal wire and the positive power source wire or that wire breakage of the signal wire has occurred, and the second threshold and the fourth threshold are corrected by the value of the power source voltage Vb that has been measured.

Consequently, the wire abnormality detecting device has the characteristic that an abnormality such as a short-to-supply fault or wire breakage is also detected in addition to an abnormal state where the signal wires 705a and 705b to 705n are an intermediate voltage state, and it can accurately detect an abnormal state by the AD converter 723 even with a small voltage drop.

In particular, the wire abnormality detecting device has the characteristic that it can alleviate the load current of the constant voltage power source circuit 730 and use a compact and inexpensive constant voltage power source circuit 730 because the supply of electricity with respect to the sensor switches 711a and 711b to 711n is performed from the variable power source circuit.

The sensor switches 711a and 711b to 711n are disposed with a first dropper circuit and the program memory 721 further includes a program serving as the ground fault abnormality determining means 403.

The first dropper circuit is configured by a voltage drop circuit using the series resistors 712a and 712b to 712n that generate a first residual voltage as a raised low level voltage when the sensor switches 711a and 711b to 711n are closed.

The ground fault abnormality determining means 403 is means that acts when the digitally converted value of the signal voltage relating to the switch logic signals D1 and D2 to Dn by the AD converter 723 is equal to or lower than the third threshold 813 that is a value smaller than the first residual voltage, and determines that a ground fault abnormality that is short circuit contact between the signal wires 705a and 705b to 705n and the negative power source wire 703 has occurred, and the first threshold 811 and the third threshold 813 are corrected by the value of the power source voltage Vb that has been measured.

Consequently, the wire abnormality detecting device has the characteristic that a ground fault abnormality is also detected in addition to an abnormal state where the signal wires 705a and 705b to 705n are an intermediate voltage state, and it can accurately detect an abnormal state by the AD converter 723 even when the power source voltage varies.

The numerous sensor switches 711a and 711b to 711n are inputted as switch logic signals to the microprocessor 720, the signal voltage relating to the switch logic signal of each of the sensor switches 711a and 711b to 711n is connected to an input circuit of the AD converter 723 sequentially via the selection switches 737a and 737b to 737n and time-division processed such that sequential abnormality determination is performed.

Consequently, the wire abnormality detecting device has the characteristic that it can economize the number of input points of the AD converter 723 and perform abnormality determination by time division processing.

The program memory 721 further includes a program serving as the simple determining means 904.

The simple determining means 904 is means that measures the signal voltage relating to the switch logic signal of the sensor switches 711*a* and 711*b* to 711*n* every substantially constant period and immediately determines that the measured signal voltage is not an intermediate voltage abnormal state when the measured signal voltage is equal to or lower than the first threshold 811 or equal to or higher than the second threshold 812.

The wire abnormality detecting device confirms and determines, by the detailed determining means 907, whether or not the signal voltage relating to the switch logic signal that has been measured is an intermediate voltage abnormality state when the signal voltage relating to the switch logic signal that has been measured exceeds the first threshold 811 and is less than the second threshold 812.

Consequently, the wire abnormality detecting device has the characteristic that it can shorten the determination time by avoiding execution of the detailed determining means 907 as long as an intermediate voltage abnormality has not occurred including an abnormality such as when the wire abnormality determination time period coincidentally matches a transitional period when the signal voltage relating to the switch logic signals changes.

In particular, the wire abnormality detecting device has the characteristic that the overall amount of time required for determination is significantly shortened because it suffices to perform determination of wire abnormality with respect to each of the sensor switches 711*a* and 711*b* to 711*n* sequentially by simple determination when performing time division determination with respect to the numerous sensor switches 711*a* and 711*b* to 711*n* and to perform detailed determination of the sensor switches 711*a* and 711*b* to 711*n* only when an intermediate voltage abnormality has exceptionally occurred.

The program memory 721 further includes a program serving as the reconfirming means 406.

The reconfirming means 406 is means that acts when the ground fault abnormality determining means 403 or the short-to-supply fault abnormality determining means 402 has detected an abnormality in the signal wires 705*a* and 705*b* to 705*n*, again executes abnormality determination by the ground fault abnormality determining means 403 or the short-to-supply fault abnormality determining means 402, and decides the abnormality determination result at the stage where a wire abnormality was able to be reconfirmed.

Consequently, the wire abnormality detecting device has the characteristic that it can improve the reliability of the abnormality determining function without mistakenly confirming and storing an abnormality determination when noise is mixed in with the signal wires 705*a* and 705*b* to 705*n*.

In embodiments 1 and 2 of this invention, in addition to detecting a wire breakage abnormality, a ground fault abnormality and a short-to-supply fault abnormality of a signal wire, there are also detected abnormalities including a short circuit abnormality between printed patterns resulting from conductive foreign matter or a soldering defect in a wire abnormality detecting device serving as an in-vehicle electronic control device or inside a jointly used sensor, or an abnormality resulting from a connection defect in a connecting connector, and the wire abnormality detecting device is configured such that, when a short circuit abnormality of an open abnormality of a sensor element itself occurs, this is recognized as a normal state where the sensor switch is normally closed or as a state where the sensor switch is normally open and the device cannot perform abnormality determination, but if it is a 2 phase type rotary encoder, it is ideal to jointly use abnormality determination that is dependent on various correlated characteristics such as the B-phase signal stopping even though the A-phase signal is being generated or each phase signal cannot be obtained even though a rotation drive command is being supplied.

Further, in a sensor switch that cannot offer a raised low level voltage or a checked high level voltage by dropper diodes or series resistors and current dividing resistors, its function can be limited to exclude ground fault abnormality determination or short-to-supply fault abnormality determination and detect only an intermediate voltage abnormality state or a wire breakage abnormality state.

However, when the sensor power source is DC 5 V and the signal wire touches another power source wire higher than DC 5 V, a touch abnormality with respect to the high voltage wire can be detected as a short-to-supply fault abnormality even if there is no function of obtaining a checked high level voltage by dropper diodes and current dividing resistors.

Various modifications and alterations of this invention will be apparent to those skilled in the art without departing from the scope and spirit of this invention, and it should be understood that this is not limited to the illustrative embodiments set forth herein.

What is claimed is:

1. A wire abnormality detecting device that detects an abnormality in a signal wire of a sensor switch that is inputted as a switch logic signal with respect to a microprocessor, wherein the microprocessor is disposed with at least a program memory including a program that serves as intermediate voltage state detecting means and detailed determining means including transitional period determining means and intermediate voltage abnormality determining means and an AD converter that measures the signal voltage level relating to the switch logic signals, the intermediate voltage state detecting means is means that determines, by monitoring the digital output of the AD converter, when the logic of the switch logic signal exceeds a first threshold corresponding to a first signal voltage when the logic of the switch logic signal is low and when the logic of the switch logic signals is less than a second threshold corresponding to a second signal voltage when the logic of the switch logic signal is high, the transitional period determining means is means that detects a transitional period when the logic level of the switch logic signal changes from a low to a high or from a high to a low level, the intermediate voltage abnormality determining means is means that acts when the intermediate voltage state detecting means has detected an intermediate voltage state, excluding a period when the transitional period determining means is detecting a transitional period, and determines that an intermediate voltage abnormality has occurred, and the wire abnormality detecting device detects, by the intermediate voltage abnormality determining means, an abnormality resulting from incomplete contact between the signal wire and a positive power source wire or a negative power source wire or from contact between the signal wire and another analog signal wire.

2. The wire abnormality detecting device of claim 1, wherein the transitional period determining means further includes first and second period determining means, the first period determining means is means that determines, as a first transitional period, a specific period immediately after the determined logic of the switch logic signal has changed from a low to a high or from a high to a low level, the second period determining means is means that determines, as a second transitional period, when the determined logic of the switch logic signal has changed from a low to a high or from a high to a low level within a specific period after the AD converter has executed digital conversion of the signal voltage relating to the switch logic signal, the specific period corresponds to a transitional period that is a maximum value of a time when the signal voltage level relating to the switch logic signal moves from the first threshold to the second threshold or a time when the signal voltage level relating to the switch logic signal moves from the second threshold to the first threshold, and a value that has been digitally converted during the first transitional period or immediately before the second transitional period as the digitally converted value of the signal voltage relating to the switch logic signal by the AD converter is excluded from the target of the intermediate voltage abnormality determination.

3. The wire abnormality detecting device of claim 1, wherein the sensor switch is disposed with a first dropper circuit and the program memory further includes a program serving as ground fault abnormality determining means, the first dropper circuit is configured by a voltage drop circuit including a dropper diode or a series resistor that generates a first residual voltage as a raised low level voltage when the sensor switch is closed, and the ground fault abnormality determining means is means that acts when the digitally converted value of the signal voltage relating to the switch logic signal by the AD converter is equal to or lower than a third threshold that is a value smaller than the first residual voltage, and determines that a ground fault abnormality that is short circuit contact between the signal wire and the negative power source wire or a wire breakage abnormality of the signal wire has occurred.

4. The wire abnormality detecting device of claim 3, wherein the program memory farther includes a program serving as reconfirming means, and the reconfirming means is means that acts when the ground fault abnormality determining means or the short-to-supply fault abnormality determining means has detected an abnormality in the signal wire, again executes abnormality determination by the ground fault abnormality determining means or the short-to-supply fault abnormality determining means, and decides the abnormality determination result at the stage where a wire abnormality was able to be reconfirmed.

5. The wire abnormality detecting device of claim 1, wherein the sensor switch is connected to a constant voltage power source circuit via a breeder resistor that configures a second dropper circuit and the program memory further includes a program serving as short-to-supply fault abnormality determining means, the second dropper circuit is configured by a voltage checking circuit resulting from a dropper diode that is series-connected with respect to the breeder resistor or a current dividing resistor that is connected in parallel to the sensor switch and is a circuit that obtains a checked high level voltage that is lower, by an amount corresponding to a second residual voltage, than a constant voltage output of the constant voltage power source circuit as a high level signal voltage when the sensor switch is closed, and the short-to-supply fault abnormality determining means is means that acts when the digitally converted value of the signal voltage relating to the switch logic signal by the AD converter is equal to or higher than a fourth threshold that is a value larger than a value where the second residual voltage is subtracted from the constant voltage output, and determines that a short-to-supply fault abnormality that is short circuit contact between the signal wire and the positive power source wire or that wire breakage of the signal wire has occurred.

6. The wire abnormality detecting device of claim 1, wherein the sensor switch is connected to a variable power source circuit via a breeder resistor that configures a second dropper circuit and a power source voltage of the variable power source circuit is digitally changed via the AD converter and inputted to the microprocessor, the program memory further includes a program serving as short-to-supply fault abnormality determining means, the second dropper circuit is configured by a voltage checking circuit resulting from a dropper diode that is series-connected with respect to the breeder resistor or a current dividing resistor that is connected in parallel to the sensor switch and is a circuit that obtains a checked high level voltage that is lower, by an amount corresponding to a second residual voltage, than the power source voltage of the variable power source circuit as a high level signal voltage when the sensor switch is opened, and the short-to-supply fault abnormality determining means is means that acts when the digitally converted value of the signal voltage relating to the switch logic signal by the AD converter is equal to or higher than a fourth threshold that is a value larger than a value where the second residual voltage is subtracted from the power source voltage, and determines that a short-to-supply fault abnormality that is short circuit contact between the signal wire and the positive power source wire or that wire breakage of the signal wire has occurred, and the second threshold and the fourth threshold are corrected by the value of the power source voltage that has been measured.

7. The wire abnormality detecting device of claim 6, wherein the sensor switch is disposed with a first dropper circuit and the program memory further includes a program serving as ground fault abnormality determining means, the first dropper circuit is configured by a voltage drop circuit using a series resistor that generates a first residual voltage as a raised low level voltage when the sensor switch is closed, the ground fault abnormality determining means is means that acts when the digitally converted value of the signal voltage relating to the switch logic signal by the AD converter is equal to or lower than a third threshold that is a value smaller than the first residual voltage and determines that a ground fault abnormality that is short circuit contact between the signal wire and the negative power source wire or that a wire breakage abnormality of the signal wire has occurred, and the first threshold and the third threshold are corrected by the value of the power source voltage that has been measured.

8. The wire abnormality detecting device of claim 1, wherein numerous sensor switches are inputted as switch logic signals to the microprocessor, the signal voltage relating to the switch logic signal of each sensor switch is connected to an input circuit of the AD converter sequentially via a selection switch and time-division processed such that sequential abnormality determination is performed.

9. The wire abnormality detecting device of claim 1, wherein the program memory further includes a program serving as simple determining means the simple determining means is means that measures the signal voltage relating to the switch logic signal of the sensor switch every substantially constant period and immediately determines that the measured signal voltage is not an intermediate voltage abnormal state when the measured signal voltage is equal to or lower than the first threshold or equal to or higher than the second threshold, and the wire abnormality detecting device determines, by the detailed determining means, whether or not the signal voltage relating to the switch logic signal that has been measured is an intermediate voltage abnormality state when the signal voltage relating to the switch logic signal that has been measured exceeds the first threshold and is less than the second threshold.

* * * * *